United States Patent
Haq et al.

(10) Patent No.: US 10,831,104 B2
(45) Date of Patent: *Nov. 10, 2020

(54) CRITICAL DIMENSION (CD) UNIFORMITY OF PHOTORESIST ISLAND PATTERNS USING ALTERNATING PHASE SHIFTING MASK

(71) Applicant: Taiwan Semiconductor Manufacturing Company, Ltd., Hsinchu (TW)

(72) Inventors: Jesmin Haq, Milpitas, CA (US); Tom Zhong, Saratoga, CA (US); Zhongjian Teng, Santa Clara, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/728,124

(22) Filed: Dec. 27, 2019

(65) Prior Publication Data

US 2020/0142313 A1 May 7, 2020

Related U.S. Application Data

(63) Continuation of application No. 16/133,869, filed on Sep. 18, 2018, now Pat. No. 10,520,818.

(51) Int. Cl.
*G03F 7/20* (2006.01)
*H01L 43/12* (2006.01)
(Continued)

(52) U.S. Cl.
CPC ............... *G03F 7/203* (2013.01); *G03F 1/30* (2013.01); *G03F 7/039* (2013.01); *G03F 7/091* (2013.01); *G03F 7/11* (2013.01); *G03F 7/2004* (2013.01); *G03F 7/2006* (2013.01); *G03F 7/2041* (2013.01); *G03F 7/322* (2013.01); *G03F 7/38* (2013.01); *H01L 43/12* (2013.01); *H01L 27/222* (2013.01)

(58) Field of Classification Search
CPC combination set(s) only.
See application file for complete search history.

(56) References Cited

U.S. PATENT DOCUMENTS 7,947,431 B2 * 5/2011 Sarma ...................... G03F 1/50
430/311
2006/0216653 A1 * 9/2006 Paxton ................ G03F 7/70466
430/315

* cited by examiner

*Primary Examiner* — Ratisha Mehta
(74) *Attorney, Agent, or Firm* — Haynes and Boone, LLP (57) ABSTRACT

A photoresist film is patterned into an array of island shapes with improved critical dimension uniformity and no phase edges by using two alternating phase shifting masks (AltPSMs) and one post expose bake (PEB). The photoresist layer is exposed with a first AltPSM having a line/space (L/S) pattern where light through alternating clear regions on each side of an opaque line is 180° phase shifted. Thereafter, there is a second exposure with a second AltPSM having a L/S pattern where opaque lines are aligned orthogonal to the lengthwise dimension of opaque lines in the first exposure, and with alternating 0° and 180° clear regions. Then, a PEB and subsequent development process are used to form an array of island shapes. The double exposure method enables smaller island shapes than conventional photolithography and uses relatively simple AltPSM designs that are easier to implement in production than other optical enhancement techniques.

20 Claims, 4 Drawing Sheets (51) Int. Cl.
*G03F 7/039* (2006.01)
*G03F 1/30* (2012.01)
*G03F 7/38* (2006.01)
*G03F 7/09* (2006.01)
*G03F 7/11* (2006.01)
*G03F 7/32* (2006.01)
*H01L 27/22* (2006.01)

CRITICAL DIMENSION (CD) UNIFORMITY OF PHOTORESIST ISLAND PATTERNS USING ALTERNATING PHASE SHIFTING MASK

PRIORITY DATA

The present application is a continuation application and claims the benefit of U.S. patent application Ser. No. 16/133,869 filed Sep. 18, 2018, herein incorporated by reference in its entirety.

RELATED PATENT APPLICATION

This application is related to the following: U.S. Pat. No. 8,865,008; which is assigned to a common assignee and is herein incorporated by reference in its entirety.

TECHNICAL FIELD

The present disclosure relates to a method of improving CD uniformity in photoresist patterns comprised of island arrays, and in particular to a sequence of exposing a photoresist film with a first alternating phase shift mask (AltPSM) having parallel opaque horizontal lines separated by alternating clear 0° and 180° phase regions, and then exposing with a second AltPSM having parallel opaque vertical lines with clear alternating 0° and 180° phase regions, and finally performing a post-expose bake and developing the photoresist film to form substantially circular or elliptical island shapes that are subsequently transferred by etch processes through a stack of underlying layers thereby forming devices such as magnetic tunnel junctions (MTJs) for semiconductor or hard disk drive (HDD) applications.

BACKGROUND

The fabrication of memory devices in semiconductor and HDD applications requires the use photolithography processes to define a pattern in a substrate. A photoresist layer on the substrate is patternwise exposed with radiation that passes through a mask (reticle) having opaque and transparent regions. After the exposed photoresist layer is developed to form a pattern therein, the pattern is etch transferred into the substrate. A common mask is a binary mask comprised of an opaque material such as chrome on a transparent substrate that is typically quartz. Light from a source such as a 248 nm or 193 nm excimer laser passes through regions not blocked by chrome on the mask and presents an aerial image on the photoresist layer. An optical reduction system comprised of a plurality of lenses is used to reduce the size of the mask pattern by a factor of 5:1, for example, in the aerial image impinging upon the photoresist surface. The aerial image has high intensity corresponding to light passing through transparent mask regions, and low intensity (dark areas) where light has been blocked by opaque regions thereby producing "exposed" and "unexposed" regions in the photoresist. A small amount of radiation does reach "unexposed" regions, particularly at borders with "exposed" regions because of diffracted light. This condition limits the minimum feature size that is formed or resolved in the photoresist film. Since there is a constant demand to decrease feature size in order to build a higher density of devices per unit area, numerous resolution enhancement techniques have been developed.

Figure 1:
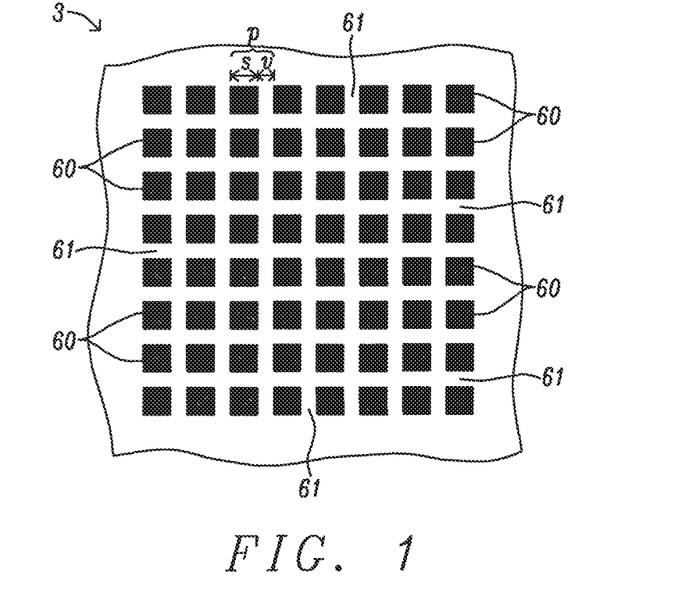
FIG. 1 is a top-down view of a conventional mask design that is used to print a plurality of island features in a photoresist layer.

The minimum feature size that can be printed in a photoresist film is defined as $R=k\lambda/NA$ where R is the minimum resolution, k is a constant for the photolithography process, $\lambda$ is the exposing wavelength, and NA is the numerical aperture of the projection optics in the exposure tool. A combination of lower k through improved process control, lower $\lambda$, and higher NA has enabled a steady reduction in technology nodes during the past 20 years from 180 nm to 45 nm and below. Note that k may also be reduced by enhancements in the mask or photolithography process including the use of attenuated masks, off-axis illumination (OAI), optical proximity correction (OPC), and other means to improve contrast between light and dark areas in the aerial image. FIG. 1 depicts a conventional binary mask for printing an array of island shapes where chrome regions 60 are separated by clear quartz regions 61. However, process latitude and resolution are limited because of poor contrast in the aerial image, especially for photoresist feature sizes that are <250 nm. The pitch p is defined as the sum of linewidth s and the adjacent space v.

A commercial photoresist solution is typically comprised of a polymer, casting solvent, and multiple additives including a photosensitive material that is coated on a wafer and baked on a hot plate to remove substantially all of the solvent and leave a photoresist film. The photosensitive component reacts when exposed to light, and generates an acid, which causes either a deprotection mechanism in a positive tone photoresist where the polymer becomes soluble in a developer solution while unexposed regions remain insoluble, or initiates a crosslinking mechanism in a negative tone photoresist where polymers crosslink to render the exposed regions insoluble in developer while unexposed regions are soluble.

Figure 2:
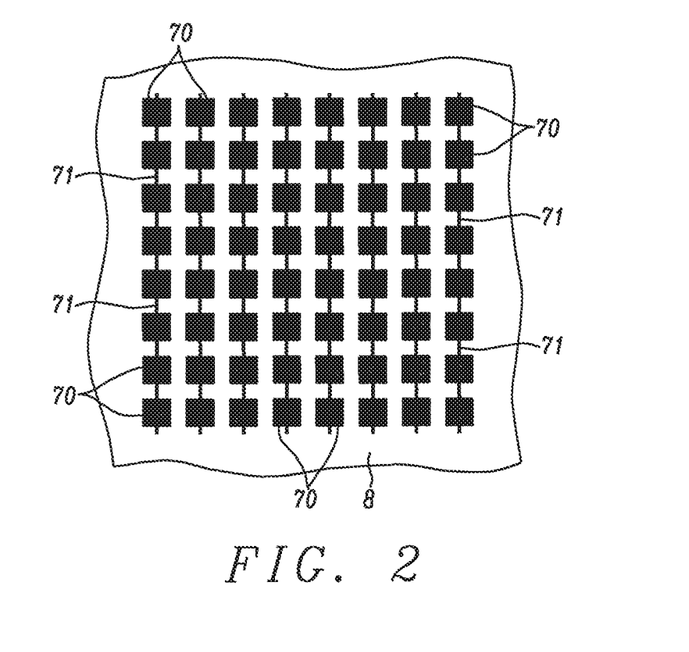
FIG. 2 is a top-down view of an island array that has been printed in a photoresist layer using a single alternating phase shift mask (AltPSM) according to a conventional method with the unwanted result of creating phase edges between island shapes.

The basic idea behind alternating phase shift masks (AltPSM) is to modify the binary reticle so that alternating clear regions will cause light to be phase shifted 180°. Since the intensity of regular phase light and the intensity of reversed phase light cancel each other in the nominally dark areas, image contrast is improved compared with non-phase shifted masks and attenuated phase shifted masks. However, there are a number of problems with AltPSM. When the layout consists of island type features used to fabricate MTJs, light from adjacent areas that is 180° out of phase will interfere destructively and result in phase edges that are unwanted connections between island features in a positive tone photoresist. As shown in FIG. 2, phase edges 71 generally appear as linear sections between the island shapes 70 in a photoresist patterned on a substrate 8 with a conventional AltPSM. Here, the phase edges are aligned vertically (y-axis direction), but may also appear as horizontal linear sections depending on mask design.

To avoid the phase edge issue, one approach is to use a negative tone photoresist. However, negative tone photoresists have drawbacks including swelling during develop, poor step coverage, a toxic stripper requirement, and sensitivity to ambient oxygen. Another possible corrective measure is introducing grated phase shifted features such as 0° to 60°, 60° to 120°, and 120° to 180° in the mask. This approach requires additional steps in reticle fabrication and a complicated mask design, and is not applicable for very tight (small) pitches. Alternatively, a second mask may be used to expose the photoresist so that the phase edges are removed during the development process. This option requires a complicated layout design that is usually not practical.

Current technology does not enable a solution for printing island features having a small pitch less than about 300 nm, and with acceptable critical dimension uniformity of <3 nm along with a suitable process window (exposure latitude and depth of focus) with AltPSM masks in a manufacturing environment. Therefore, a new photolithography process is needed to enable further advances in realizing high density patterns required for semiconductor and magnetic recording devices that rely on island shapes, which are subsequently etch transferred through an underlying stack of layers to form an array of MTJs, for example.

SUMMARY

One objective of the present disclosure is to provide a method involving AltPSM technology to print island shaped photoresist patterns with CDs <100 nm and with improved CD uniformity for semiconductor and magnetic devices based on MTJs.

A second objective of the present disclosure is to provide a method for achieving the first objective that is based on an AltPSM design that is readily fabricated and suitable for a manufacturing environment.

According to one embodiment, these objectives are achieved by initially depositing a MTJ stack of layers on a substrate formed on a wafer where the MTJ stack comprises a reference layer, a free layer, and a tunnel barrier between the RL and FL. The RL has a fixed magnetization preferably in a perpendicular to plane direction while the FL has a magnetization that is free to rotate between parallel and antiparallel directions with respect to the RL. There may be a seed layer as the bottommost layer and a capping layer as the uppermost layer in the MTJ stack. A bottom antireflective coating (BARC) or a dielectric antireflective coating (DARC) is deposited on the capping layer and serves to improve CD uniformity during a subsequent photoresist patterning step. A photoresist layer that is preferably a positive tone type is coated on the BARC/DARC and is patternwise exposed twice before a post expose bake and pattern development is performed to form an array of island shapes in rows and columns.

A key feature is that the photoresist layer is first patternwise exposed through a first AltPSM having a plurality of opaque and alternating transparent (clear) regions each with a line shape aligned in a vertical direction (i.e. y-axis direction). The alternating clear regions cause the light during the exposure to be phase shifted 180°. The 0° and 180° clear regions on the first AltPSM have a width w1 and w2, respectively, while each of the opaque regions have a width w3. In some embodiments, w1=w2. Moreover, w3 is variable depending on the desired pitch, which is (w1+w3) or (w2+w3). Typically, the alternating clear regions are 180® out of phase by etching trenches between the chrome lines on a front side of the mask. Thus, a first set of trenches corresponding to 0° clear regions has a first depth t1 into the quartz mask while a second set of trenches corresponding to 180° clear regions has a second depth t2 where t1 is unequal to t2. The first patternwise exposure is performed while the wafer is on a wafer stage in an exposure tool that may have a 193 nm or 248 nm excimer laser light source, or an extreme UV light source with a 13.5 nm wavelength.

Thereafter, the wafer remains on the wafer stage and is subjected to a second patternwise exposure through a second AltPSM having a plurality of opaque and alternating transparent (clear) regions each with a line shape aligned in a horizontal direction (i.e. x-axis direction) that is orthogonal to the vertical direction. Again, the alternating clear regions cause the light during the exposure to be phase shifted 180°. The 0° and 180° clear regions on the second AltPSM have a width w4 and w5, respectively, while each of the opaque regions have a width w6. In some embodiments, w4=w5. If circular island shapes are desired, then w1=w4. However, if elliptical island shapes are to be printed, then w1 is greater than or less than w4 depending on the desired long axis direction in the resulting elliptical shapes. A third set of trenches corresponding to 0° clear regions in the second AltPSM has a third depth t3 into the quartz mask while a fourth set of trenches corresponding to 180° clear regions has a fourth depth t4 where t3 is unequal to t4.

In the following step, the wafer is post expose baked on a hot plate to drive the chemical reaction to completion that is caused by the release of photogenerated acid in exposed regions of the photoresist layer. Next, the wafer is developed with an aqueous base solution such as 0.26 N tetramethylammonium hydroxide (TMAH), for example, to wash away exposed regions, and is then rinsed with DI water and dried to provide a pattern of island shapes on the BARC/DARC top surface.

The pattern of island shapes in the photoresist mask layer is then transferred successively through the BARC/DARC and the MTJ stack by a plurality of ion beam etch (IBE) or reactive ion etch (RIE) processes to generate a plurality of islands (MTJ cells) each having a sidewall that extends from a capping layer top surface to the substrate. The photoresist and BARC/DARC are removed during the IBE or RIE processes. In some embodiments, one or more RIE steps may be used with one or more IBE steps for the etch transfer of the island shape through the BARC/DARC and through the MTJ stack. In alternative embodiments, the MTJ stack is replaced by another stack of layers that is patterned into active devices with island shapes.

DETAILED DESCRIPTION

The present disclosure is a method of printing an array of island shapes in a positive tone photoresist layer on a substrate with a process involving two AltPSM to provide island shapes with no phase edges, and improved CD compared with prior art photolithography methods involving AltPSM. The resulting photoresist pattern may be formed on a MTJ stack of layers, or on other stacks of layers that are subsequently patterned into devices for semiconductor or HDD applications. The photoresist pattern may be etch transferred through a MTJ stack to produce an array of MTJ cells used in magnetic random access memory (MRAM) or in spin transfer MRAM (STT-MRAM) applications. In the drawings, each layer is laid out in the (x, y) plane, and a thickness of each layer is in the z-axis direction.

Figure 3:
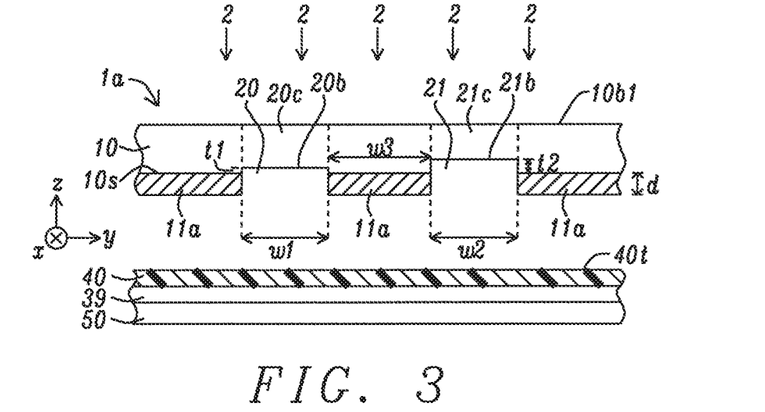
FIG. 3 is cross-sectional view and FIG. 4 is a top-down view of a first AltPSM according to an embodiment of the present disclosure where alternating clear regions on the mask cause light to be phase shifted by 180° and are linear shapes (trenches) having widths w1 and w2 formed on each side of an opaque line.

According to a first embodiment of the present disclosure depicted in FIG. 3, a photoresist layer 40 is coated on a BARC or DARC 39 that in turn is formed on substrate 50. The substrate is disposed on a wafer made of Si or the like that typically has a diameter of 6", 8", or 12". A photoresist solution may be dispensed onto the BARC or DARC/substrate stack as the wafer is held on a wafer chuck and rotated in a spin bowl. Then, the wafer is moved to another station that may be a hot plate where a so-called post-apply bake (PAB) is performed to remove substantially all of the casting solvent from the photoresist layer. Next, the wafer is moved to an exposure tool and held on a workpiece (not shown) such as a wafer stage.

Once a well known alignment process of the first AltPSM to the wafer is completed, the photoresist layer is exposed through the first AltPSM 1a with light 2 from an excimer laser including but not limited to a 193 nm or 248 nm excimer light source in the exposure tool, or with a wavelength proximate to 13.5 nm from an extreme ultraviolent (EUV) source, and impinges on first AltPSM backside 10b1. In some embodiments, the light exposure may occur in an immersion lithography system as appreciated by those skilled in the art. Moreover, a topcoat (not shown) may be formed on a top surface of the photoresist prior to the first exposure as a protective measure to prevent water or airborne chemicals from entering the photoresist between exposure and image development. As a result, the deprotection mechanism caused by the photogenerated acid is not disrupted and is able to proceed to completion during a post expose bake. The topcoat is water soluble and is removed during development of the photoresist pattern.

The first AltPSM is made of a quartz substrate 10, and opaque features 11a each having a width w3 and thickness d that are formed on a side 10s of the first AltPSM facing the photoresist film 40. Only a portion of AltPSM 1a is shown in order to simplify the drawing. It should be understood that an AltPSM may have millions of opaque features (i.e. lines) that are made of chrome or the like.

There are clear regions in the first AltPSM that are 180° phase shifted on opposite sides of each opaque feature 11a. One of the clear regions is comprised of trench 20 having width w1 and backside 20b, and a portion 20c of quartz substrate 10 of width w1 between trench backside 20b and mask backside 10b1. A second clear region is comprised of trench 21 having width w2 and backside 21b, and a portion 21c of the quartz substrate of width w2 between trench backside 21b and mask backside 10b1. According to one embodiment w1=w2. In one embodiment, the first clear region is a 00 clear region where trench 20 has a depth t1, and the second clear region is a 180° clear region where trench 21 has a depth t2 where t2>t1. However, in alternative embodiments, the first clear region may be a 180° clear region while the second clear region is a 0° clear region. Trenches are formed during mask fabrication by etching into AltPSM 1a using chrome features 11a as an etch mask. Dimensions w1, w2, and w3 are aligned in a y-axis direction during the first exposure.

Figure 4:
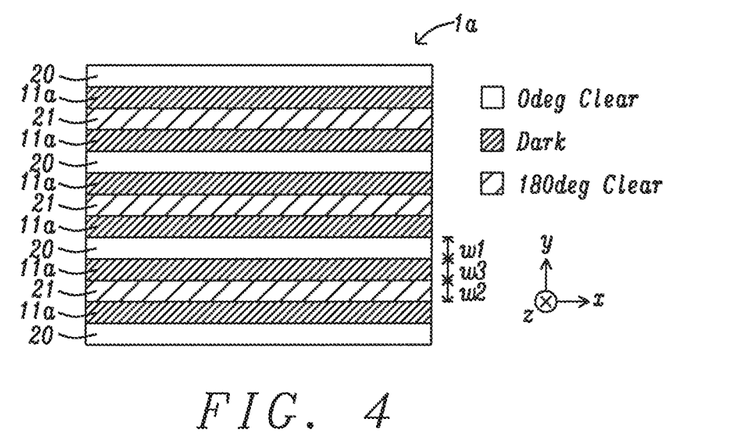

Referring to FIG. 4, a top-down view of first AltPSM 1a is illustrated. Again, the number of line shapes is significantly reduced from an actual mask in order to simplify the drawing. In the exemplary embodiment, the opaque regions 11a are line shapes, and the alternating 0° and 180° clear regions comprised of trenches 20, 21, respectively, are also line shapes that have a lengthwise dimension along the x-axis direction. Although width w3 of the opaque regions is shown to be larger than w1 and w2 of the clear regions, w3 may be equal to or smaller than w1 and w2 in alternative embodiments. The chrome lines and clear regions (spaces) form a repeating line/space (L/S) pattern with a pitch that is (w1+w3) or (w2+w3). For example, in one embodiment where w1=w2=w3, the lines and spaces form a 1:1 L/S pattern. It should be understood that the light (not shown) in the aerial image impinging on the photoresist layer 40 in FIG. 3 has a 1:1 L/S pattern but the L/S pattern is reduced by an optical reduction factor N that is an integer greater than 1, such as 5 or 10, for example. Thus, with a 5:1 optical reduction system where N=5, the width of the unexposed regions in the photoresist layer will be ⅕×w3 and the width of exposed regions will be ⅕×w1 (and ⅕ w2).

Figure 5:
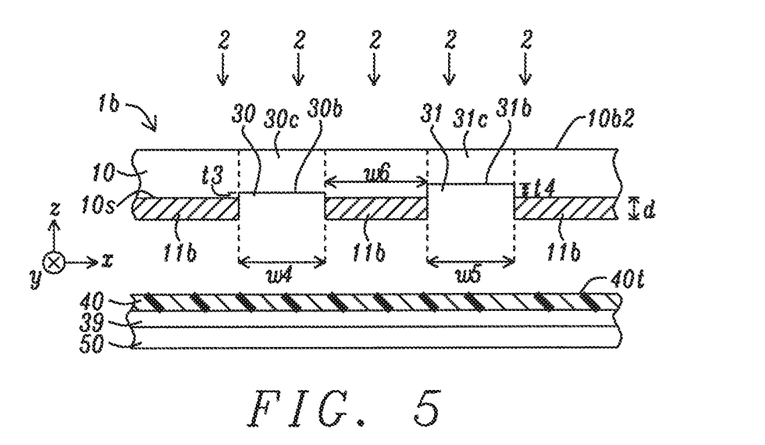
FIG. 5 is cross-sectional view and FIG. 6 is a top-down view of a second AltPSM of the present disclosure where alternating 0° and 180° clear regions on the mask are linear shapes oriented orthogonal to the linear shapes in the first AltPSM, and have widths w3 and w4 formed on each side of an opaque line.

Referring to FIG. 5, during the second exposure step of the present disclosure, the substrate 50 and wafer (not shown) continue to be held on the same wafer stage in the same exposure tool as used in FIG. 3. In this case, the first AltPSM is removed and a second AltPSM 1b is aligned above the previously exposed photoresist layer from FIG. 3. During the second exposure, chrome lines 11b on the second AltPSM are aligned orthogonal to the position of chrome lines 11a in the first exposure. Thereafter, a second exposure with light 2 is performed.

The second AltPSM 1b is made of a quartz substrate 10, and opaque features 11b each having a width w6 and thickness d that are formed on a side 10s of the second AltPSM facing the photoresist film 40. There are clear regions in the second AltPSM that are 180° phase shifted on opposite sides of each opaque feature 11b. One of the clear regions is comprised of trench 30 having width w4 and backside 31b, and a portion 30c of quartz substrate 10 of width w4 between trench backside 30b and mask backside 10b2. A second clear region is comprised of trench 31 having width w5 and backside 31b, and a portion 31c of the quartz substrate of width w5 between trench backside 31b and mask backside 10b2. According to one embodiment w4=w5. In one embodiment, the first clear region is a 0° clear region where trench 30 has a depth t3, and the second clear region is a 180° clear region where trench 31 has a depth t4 where t4>t3. However, in alternative embodiments, the first clear region may be a 180° clear region while the second clear region is a 0° clear region. The trenches are formed by etching into AltPSM 1b using chrome features 11b as an etch mask during mask fabrication. Dimensions w4, w5, and w6 are aligned in a x-axis direction during the second exposure.

Figure 6:
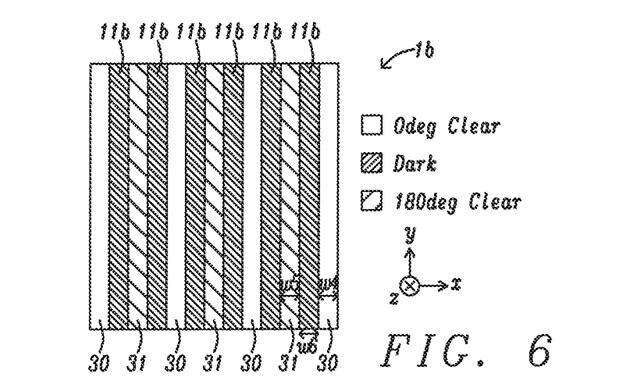

FIG. 6 depicts a view of a portion of the second AltPSM 1b from a perspective of the photoresist surface 40t during the second exposure. In the exemplary embodiment, the opaque regions 11b are line shapes, and the alternating 0° and 180° clear regions comprised of trenches 30, 31, respectively, are also line shapes that have a lengthwise dimension along the y-axis direction. Although width w6 of the opaque regions is shown to be larger than w4 and w5 of the clear regions, w6 may be equal to or smaller than w4 and w5 in alternative embodiments. The chrome lines and clear regions (spaces) have a repeating line/space (L/S) pattern with a pitch that is (w4+w6) or (w5+w6). The L/S pattern in the second AltPSM is reduced by an optical reduction factor N that is an integer >1, such as 5 or 10 in the aerial image impinging on the photoresist. Accordingly, with a 5:1 optical reduction system, the width of the unexposed regions in the photoresist layer will be ⅕×w6, and the width of exposed regions will be ⅕×w4 (and ⅕ w5).

After the second exposure, the wafer with substrate 50 and overlying photoresist layer 40 is moved to a hot plate where a post exposure bake (PEB) is performed at a temperature between 90° C. and 150° C. for 1 to 2 minutes although other PEB temperatures and times may be acceptable depending on the photoresist composition. Note that the exposure tool is preferably linked to a wafer track where a wafer is moved from one station to another to complete a particular step. Thus, the photoresist coating, PAB, PEB steps are preferably completed at separate stations that are all connected to the wafer track. In addition, there is at least one developer station linked to the wafer track. The developer station is usually comprised of a wafer chuck inside a spin bowl. Following the PEB step, the wafer is moved to a developer station where an aqueous base solution is dispensed onto the photoresist film while the wafer is rotated. After a certain amount of time has elapsed, a DI water solution is dispensed onto the photoresist while the wafer continues to spin in the spin bowl. Finally, the wafer is spun for a plurality of seconds after the water dispensing is stopped to leave a pattern in the photoresist layer that now has an essentially dry surface.

Figure 7:
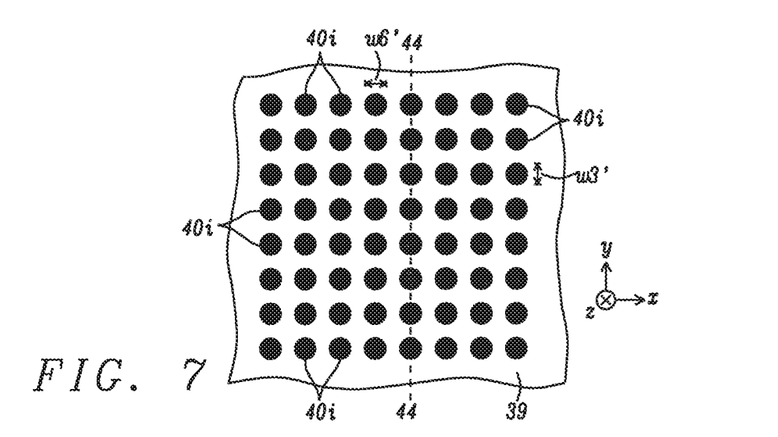
FIG. 7 is a top-down view of an island array printed in a photoresist layer as a result of first and second patternwise exposures through the first and second AltPSM, respectively, and then performing a post expose bake and development according to an embodiment of the present disclosure.

FIG. 7 is a top-down view of photoresist layer following the image development step at the developer station. Each of the resulting photoresist island shapes 40i have a width w6' in the x-axis direction and length w3' in the y-axis direction where w6' is proximate to 1/N×w6 in the second AltPSM, and where w3' is proximate to 1/N×w3 in the first AltPSM. According to one embodiment where w3=w6, essentially circular island shapes 40i are formed when essentially equivalent exposure doses are used for the first and second patternwise exposures. In other embodiments where w3 is unequal to w6, elliptical shapes are produced wherein the long axis is in the x-axis direction (w6'>w3'), or wherein the long axis is in the y-axis direction (when w3'>w6'). The present disclosure also encompasses an embodiment where the relative doses of the first and second exposure may be another technique used to adjust the island shape. For example, when w3=w6, the first patternwise exposure may comprise a different dose than the second patternwise exposure thereby yielding an elliptical shape after subsequent PEB and development steps. Thus, if the first patternwise exposure employs a higher dose than the second patternwise exposure, the photoresist is effectively "overexposed" in the y-axis direction relative to the x-axis direction which means the resulting photoresist islands will have w3'<w6'. BARC or DARC 39 is exposed in openings between the island shapes after the development step.

Figure 8:
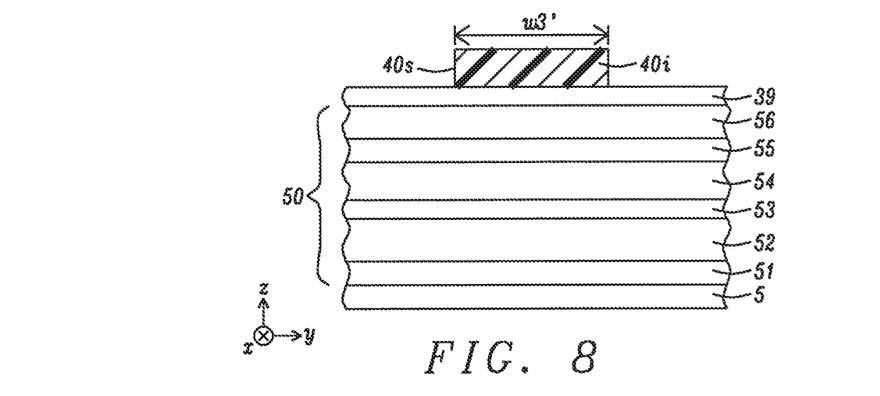
FIG. 8 is a cross-sectional view of one of the photoresist islands in FIG. 7 that is formed on a BARC or DARC top surface, and above a MTJ stack of layers.

Referring to FIG. 8, a cross-sectional view of a photoresist island 40i and underlying stack of layers is taken at plane 44-44 in FIG. 7. Only one island is shown in order to provide an enlarged view. Each photoresist island 40i has sidewall 40s and length w3' in the y-axis direction. In this embodiment, substrate 50 may be a MTJ stack of layers having a bottommost seed layer 51 formed on a bottom electrode 5, for example. A reference layer 52, tunnel barrier 53, free layer 54, Hk enhancing layer 55, and capping layer (hard mask) 56 are sequentially formed on the seed layer. However, the present disclosure is not limited to the bottom spin valve configuration shown in FIG. 8 and anticipates that other MTJ configurations may be used in MTJ stack 50. The compositions of the MTJ layers are found in related U.S. Pat. No. 8,865,008 and are not described herein. In alternative embodiments, MTJ stack 50 may be replaced with one or more layers that are subsequently patterned using island shape 40i as an etch mask to form devices in semiconductor or HDD applications.

Figure 9:
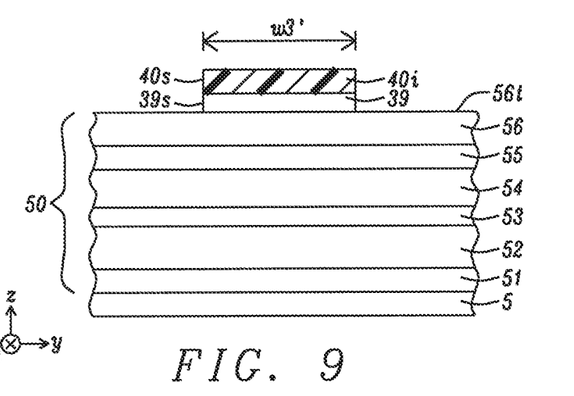
FIG. 9 is a cross-sectional view of the intermediate structure in FIG. 8 after an etch step is used to transfer the island shape through the BARC/DARC.

Referring to FIG. 9, photoresist island shape 40i in FIGS. 7-8 serves as an etch mask while a first etch is performed that may be an ion beam etch (IBE) or reactive ion etch (RIE) to transfer the shape 40i through the BARC or DARC 39 thereby yielding BARC/DARC sidewalls 39s that are coplanar with sidewall 40s.

Figure 10:
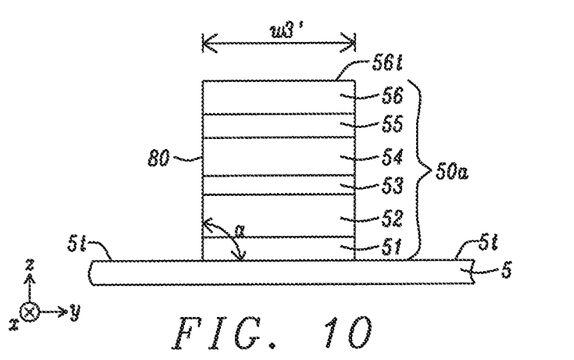
FIG. 10 is a cross-sectional view after an etch process comprised of a plurality of IBE and/or RIE steps is performed to transfer the island pattern in FIG. 9 through the MTJ stack of layers to form a MTJ cell with a sidewall.

Thereafter, in FIG. 10, one or more IBE or RIE steps, or a combination of IBE and RIE steps are performed to transfer the island shape having length w3' and width w6' through the MTJ stack 50 and stop on top surface 5t of the bottom electrode thereby yielding a MTJ cell 50a. A plurality of other MTJ cells is formed simultaneously with MTJ cell 50a but only one cell is depicted to simplify the drawing. Typically, photoresist islands 40i and BARC/DARC 39 are etched away during the MTJ etch to leave a sidewall 80, and a top surface 56t on the MTJ hard mask 56 that has a length essentially equal to w3' and a width w6'. Depending on the nature of the MTJ etch process, MTJ sidewall angle a may be from 70° to 90°.

Figure 11:
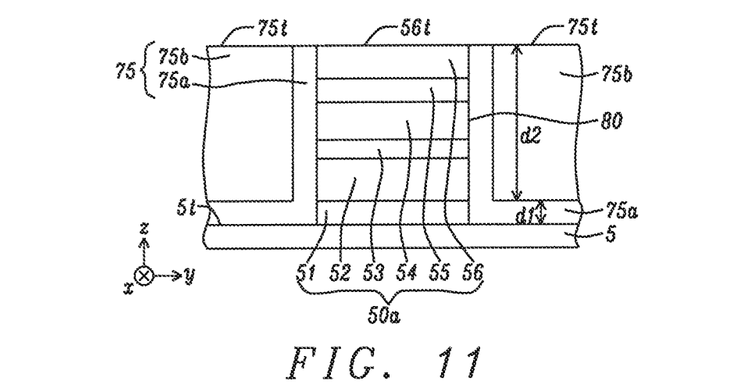
FIG. 11 is a cross-sectional view of the MTJ cell in FIG. 10 after an encapsulation layer is deposited to electrically isolate the MTJ cell from adjacent MTJ cells in the island array.

Referring to FIG. 11, an encapsulation layer 75 that may include first sub-layer 75a with thickness d1, and second sub-layer 75b with thickness d2 is deposited by a physical vapor deposition (PVD) method or the like to fill openings between MTJ cell 50a and adjacent MTJ cells that are not shown. According to the exemplary embodiment, the first sub-layer is conformally deposited on bottom electrode top surface 51 and on MTJ sidewall 80. A planarization method such as a chemical mechanical polish (CMP) process is used to form a MTJ hard mask top surface 56t that is coplanar with a top surface 75t of the encapsulation layer. Thereafter, a conventional series of steps are employed to form a top electrode and overlying layers (not shown) on the MTJ cell 50a and encapsulation layer to complete the fabrication of a MRAM or STT-MRAM device.

The photolithography sequence involving two AltPSM as disclosed herein enables a smaller resolution limit for island features, and improved CD uniformity compared with binary and attenuated phase shift masks. Moreover, the AltPSM mask fabrication is simplified compared with more complicated designs used in existing AltPSM technology to avoid phase edge issues. Furthermore, the L/S designs on the two AltPSM are considerably easier to produce than in current process flows where a first AltPSM is employed to form an island shape, and then a second AltPSM with a complicated design is required to clear the phase edges. Although exposure of a negative tone photoresist through an AltPSM conceptually avoids phase edge concerns, this technique introduces new problems that currently have no acceptable solution. The process sequence of the present disclosure may be readily implemented in existing manufacturing lines since no new tools or materials are required.

While this disclosure has been particularly shown and described with reference to, the preferred embodiment thereof, it will be understood by those skilled in the art that various changes in form and details may be made without departing from the spirit and scope of this disclosure.

We claim:

1. A method comprising;
    forming a photoresist material layer over a substrate;
    performing a first exposure process on the photoresist material layer using a first alternating phase shifting mask (AltPSM), the first AltPSM including a first opaque line extending in a first direction and having a first width, a first clear region extending in the first direction on a first side of the first opaque line and having a second width and a second clear region extending in the first direction on a second side of the first opaque line and having a third width, the second side of the first opaque line being opposite the first side, wherein light passing through the second clear region is phase shifted by 180° with respect to light passing through the first clear region during the first exposure process; and
    performing a second exposure process on the photoresist material layer using a second AltPSM, the second AltPSM including a second opaque line extending in a second direction and having a fourth width, a third clear region extending in the second direction on a first side of the second opaque line and having a fifth width and a fourth clear region extending in the second direction on a second side of the second opaque line and having a sixth width, the second side of the second opaque line being opposite the first side and the second direction being perpendicular to the first direction, wherein light passing through the fourth clear region is phase shifted by 180° with respect to light passing through the third clear region during the second exposure process.

2. The method of claim 1, wherein the first clear region is a 0° clear region, and
    wherein the second clear region is a 180° clear region.

3. The method of claim 1, wherein the first opaque line is formed of a material that includes chromium, and
    wherein the AltPSM includes a quartz substrate and the first and second clear regions are formed of the quartz a substrate.

4. The method of claim 1, wherein the first opaque line, the first clear region and the second clear region each extends a first length in the first direction, and
    wherein the second opaque line, the third clear region and the fourth clear region each extends a second length in the second direction.

5. The method of claim 1, wherein the second width is equal to the third width and the first width is different than the second and third widths, and
    wherein the fifth width is equal to the sixth width and the fourth width is different than the fifth and sixth widths.

6. The method of claim 1, further comprising:
    performing a baking process on the photoresist material layer after performing the first and second exposure processes; and
    developing the baked photoresist material layer to form a patterned photoresist material layer.

7. The method of claim 1, wherein the photoresist material layer includes a positive photoresist material.

8. A method comprising;
    forming a positive photoresist material layer over a substrate;
    performing a first exposure process on the positive photoresist material layer using a first alternating phase shifting mask (AltPSM), the first AltPSM including a first plurality of first opaque lines extending in a first direction parallel with respect to each other and a first plurality of first clear regions extending in the first direction parallel with respect to each other, wherein each first opaque line is separated from an adjacent first opaque line by one of the first clear regions from the first plurality of clear regions, wherein first clear regions on opposite sides of each first opaque line are phase shifted 180° with respect to each other for light passing there through during the first exposure process; and
    performing a second exposure process on the positive photoresist material layer using a second AltPSM, the second AltPSM including a second plurality of second opaque lines extending in a second direction parallel with respect to each other and a second plurality of second clear regions extending in the second direction parallel with respect to each other, the second direction being perpendicular to the first direction, wherein each second opaque line is separated from an adjacent second opaque line by one of the second clear regions from the second plurality of second clear regions, wherein second clear regions on opposite sides of each second opaque line are phase shifted 180° with respect to each other for light passing there through during the second exposure process;
    performing a baking process on the positive photoresist material layer after performing the first and second exposure processes; and
    developing the baked positive photoresist material layer to form a patterned photoresist layer.

9. The method of claim 8, further comprising:
    forming a stack of magnetic tunnel junction (MTJ) layers over the substrate prior to forming the positive photoresist material layer over the substrate; and
    patterning the stack of MTJ layers using the patterned photoresist layer as a mask to form a patterned MTJ structure;
    a forming an encapsulation layer on the patterned MTJ structure.

10. The method of claim 9, wherein the patterning of the stack of the MTJ layers includes performing an etching process selected from the group consisting of ion beam etching and reactive ion etching.

11. The method of claim 8, wherein the first exposure process and the second exposure process include performing an extreme ultraviolet exposure process.

12. The method of claim 8, wherein the first exposure process and the second exposure process include utilizing a laser.

13. The method of claim 8, wherein the first plurality of first opaque lines each have a first width and the second plurality of second opaque lines each have the first width, and
    wherein the patterned photoresist layer includes circular island shapes.

14. The method of claim 8, wherein the first plurality of first opaque lines each have a first width and the second plurality of second opaque lines each have a second width that is different than the first width, and
wherein the patterned photoresist layer includes elliptical island shapes.

15. The method of claim 8, wherein the first exposure process is performed at a first exposure dosage and the second exposure process is performed at a second exposure dosage that is different than the first exposure dosage,
wherein the first plurality of first opaque lines each have a first width and the second plurality of second opaque lines each have the first width, and
wherein the patterned photoresist layer includes elliptical island shapes.

16. A method comprising:
forming a stack of magnetic tunnel junction (MTJ) layers over a substrate;
forming a positive photoresist material layer on the stack of the MTJ layers;
performing a first exposure process on the positive photoresist material layer using a first alternating phase shifting mask (AltPSM), the first AltPSM including a repeating pattern of a first clear region, a first opaque line and a second clear region extending in a first direction parallel with respect to each other, wherein the first clear region has a first phase shift property and the second clear region has a second phase shift property that is different than the first phase shift;
performing a second exposure process on the positive photoresist material layer using a second AltPSM, the second AltPSM including a repeating pattern of a third clear region, a second opaque line and a fourth clear region extending in a second direction parallel with respect to each other, the second direction being orthogonal to the first direction, wherein the third clear region has a third phase shift property and the fourth clear region has a fourth phase shift property that is different than the third phase shift; and
performing a baking process on the positive photoresist material layer after performing the first and second exposure processes; and
developing the baked positive photoresist material layer to form a patterned photoresist layer; and
patterning the stack of MTJ layers using the patterned photoresist layer as a mask to form a patterned MTJ structure.

17. The method of claim 16, wherein light passing through the second clear region is phase shifted by 180° with respect to light passing through the first clear region during the first exposure process, and
wherein light passing through the fourth clear region is phase shifted by 180° with respect to light passing through the third clear region during the second exposure process.

18. The method of claim 16, wherein the first AltPSM includes a quartz substrate and wherein the first clear region includes a first portion of the quartz substrate having a first thickness and
wherein the second clear region includes a second portion of the quartz substrate having a second thickness that is different than the first thickness.

19. The method of claim 16, wherein at least one of the first and second exposure processes includes performing an immersion lithography process.

20. The method of claim 16, wherein the first opaque line, the first clear region and the second clear region each extends a first length in the first direction, and
wherein the second opaque line, the third clear region and the fourth clear region each extends a second length in the second direction.

* * * * *